(12) United States Patent
Huang

(10) Patent No.: US 7,943,994 B2
(45) Date of Patent: May 17, 2011

(54) INTEGRATED PMOS TRANSISTOR AND SCHOTTKY DIODE

(75) Inventor: Chih-Feng Huang, Jhubei (TW)

(73) Assignee: Richtek Technology Corporation, R.O.C., Hsin-Chu (TW)

(*) Notice: Subject to any disclaimer, the term of this patent is extended or adjusted under 35 U.S.C. 154(b) by 158 days.

(21) Appl. No.: 12/470,534

(22) Filed: May 22, 2009

(65) Prior Publication Data
US 2010/0295092 A1    Nov. 25, 2010

(51) Int. Cl.
*H01L 29/66* (2006.01)
(52) U.S. Cl. .. 257/341; 257/449; 257/471; 257/E21.186
(58) Field of Classification Search .................. 257/133, 257/471, 341, 390, 449–457, E21.186
See application file for complete search history.

(56) References Cited

U.S. PATENT DOCUMENTS

| 4,801,983 A * | 1/1989 | Ueno et al. ................ 257/390 |
| 6,049,108 A * | 4/2000 | Williams et al. ............ 257/341 |

\* cited by examiner

*Primary Examiner* — Evan Pert
*Assistant Examiner* — Scott Wilson
(74) *Attorney, Agent, or Firm* — Tung & Associates

(57) ABSTRACT

The present invention discloses an integrated PMOS transistor and Schottky diode, comprising a PMOS transistor which includes a gate, a source, a drain and a channel region between the source and drain, wherein the source, drain and channel region are formed in a substrate, and a parasitic diode is formed between the drain and the channel region; and a Schottky diode formed in the substrate and connected in reverse series with the parasitic diode, the Schottky diode having one end connected with the parasitic diode and the other end connected with the source.

8 Claims, 2 Drawing Sheets

US 7,943,994 B2

INTEGRATED PMOS TRANSISTOR AND SCHOTTKY DIODE

FIELD OF INVENTION

The present invention relates to an integrated device of a PMOS transistor and a Schottky diode.

DESCRIPTION OF RELATED ART

A power management circuit often requires a power switch device formed by a stand-alone PMOS transistor and a stand-alone Schottky diode. Referring to FIG. 1, a PMOS transistor 14 and a Schottky diode 12 are connected in series to form the power switch device, wherein the PMOS transistor 14 includes a parasitic diode 14D formed between the drain and the channel region of the transistor 14. A control circuit 10 controls the gate of the PMOS transistor 14 to convert an input voltage Vin to an output voltage Vo. The Schottky diode 12 is provided for blocking current flowing reversely via the parasitic diode 14D when the output voltage Vo is higher than the input voltage Vin, so that the reverse current does not occur to damage the input voltage Vin.

The drawbacks of the above mentioned prior art are that the stand-alone PMOS transistor and the stand-alone Schottky diode occupy a large amount of circuit area, and that their connection in series increases the On-time resistance Ron between the input voltage Vin and the output voltage Vo. Under large current condition, a voltage drop caused by the on-time resistance Ron can be as high as 0.8V or even higher, resulting in considerable power consumption.

In view of the foregoing problem of the prior art, the present invention provides an integrated device of a PMOS transistor and a Schottky diode to reduce the circuit area of the power switch device and to lower the on-time resistance.

SUMMARY OF THE INVENTION

An objective of the present invention is to provide an integrated device of a PMOS transistor and a Schottky diode. This integrated device can be a planar type or a trench type device.

In order to achieve the foregoing objective, in one perspective, the present invention provides an integrated device of a PMOS transistor and a Schottky diode, comprising: a PMOS transistor which includes a gate, a source, a drain and a channel region between the source and drain, wherein the source, drain and channel region are formed in a substrate, and a parasitic diode is formed between the drain and the channel region; and a Schottky diode formed in the substrate and connected in reverse series with the parasitic diode, the Schottky diode having one end connected with the parasitic diode and the other end connected with the source.

Preferably, the Schottky diode includes a portion of a well region having the same conductive type as the channel region and not having an ohmic contact.

Preferably, the Schottky diode further includes a doped region having a different conductive type from the channel region.

In another perspective, the present invention provides an integrated device of a PMOS transistor and a Schottky diode, comprising: a substrate; a conductive layer forming a gate of the PMOS transistor on the substrate; a first N-type well region, a portion of which forms a channel region of the PMOS transistor in the substrate; a first P-type doped region forming a drain of the PMOS transistor in the first well region, wherein a parasitic diode is formed between the drain and the well region; a second P-type doped region forming a source of the PMOS transistor in the first well region; and a Schottky diode formed by another portion of the first well region and connected in reverse series with the parasitic diode, said another portion of the first well region not having an N-type ohmic contact.

Preferably, said another portion of the first well region further includes a third P-type doped region.

In yet another perspective, the present invention provides an integrated device of a PMOS transistor and a Schottky diode, comprising: a P-type substrate forming a drain of the PMOS transistor; two conductors filled in the substrate to form a gate of the PMOS transistor; an N-type well region between the two conductors, the N-type well region having a portion which forms a channel region of the PMOS transistor, wherein a parasitic diode is formed between the drain and the channel region; a P-type doped region forming a source of the PMOS transistor above the N type well region; and a Schottky diode formed by another portion of the first well region and connected in reverse series with the parasitic diode, said another portion of the first well region not having an N-type ohmic contact.

Preferably, at least two P-type doped regions are provided above the N type well region.

Preferably, the substrate includes a body with a higher doping concentration and an epitaxially grown region with a lower doping concentration above the body.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustration only, but not drawn according to actual scale.

Figure 1:
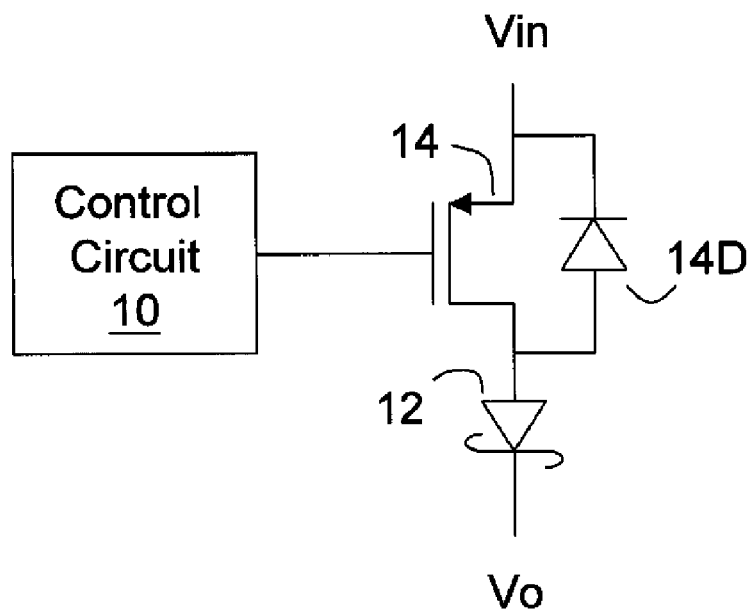
FIG. 1 shows a power switch device in the prior art, which includes a stand-alone PMOS transistor and a stand-alone Schottky diode.
Figure 2:
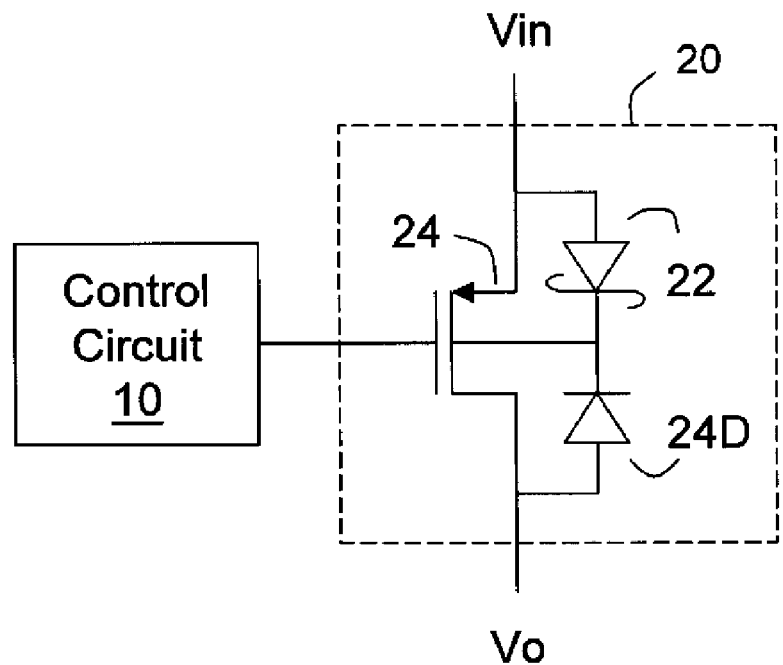
FIG. 2 is a circuit diagram shows an embodiment of the present invention.

Please refer to FIG. 2, which shows an embodiment of the present invention by way of a circuit diagram. As shown in the drawing, this embodiment provides a Schottky diode 22 which is not connected with the PMOS transistor 24 in series, but is integrated as a portion of the PMOS transistor 24 to form a power switch device 20. The Schottky diode 22 is formed on the same semiconductor substrate of the PMOS transistor 24, connected in reverse series with a parasitic diode 24D of the PMOS transistor 24. The parasitic diode 24D is formed between a drain and a channel of the PMOS transistor 24. By this structure, the power transmission between the input voltage Vin and the output voltage Vo is only adversely affected by the on-time resistance of the PMOS transistor 24, without a voltage drop caused by the Schottky diode. Thus, the power consumption of the present invention can be considerably reduced.

Figure 3:
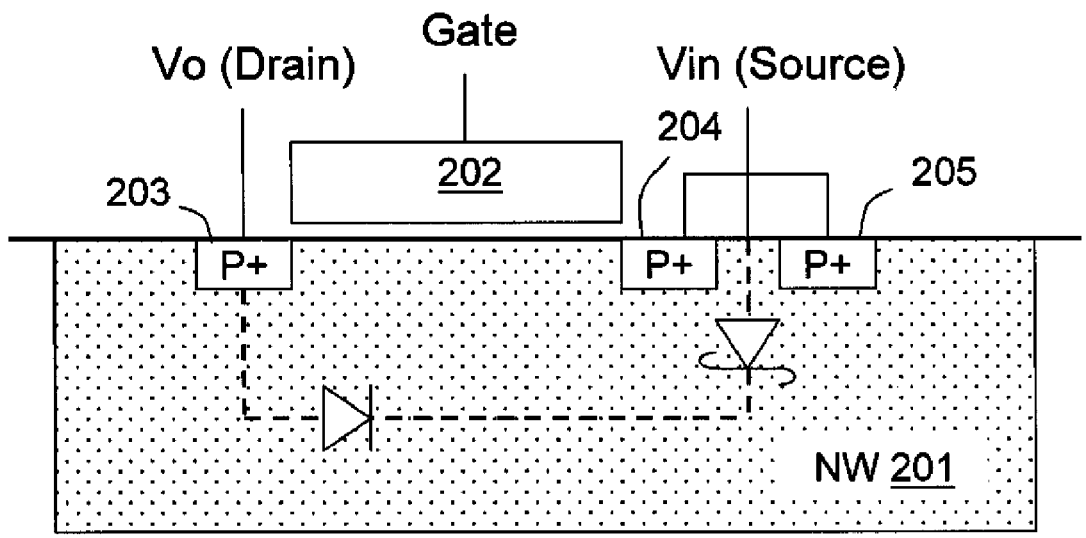
FIG. 3 illustrates an embodiment as to how the present invention may be embodied by a semiconductor structure.

FIG. 3 shows an example as to how the present invention can be embodied by semiconductor. As shown in the figure, an N type well region 201 is formed in a substrate, and a gate oxide layer (not shown) and a gate layer 202 is deposited and formed on the substrate. Next, P+ heavily doped regions 203 and 204 are formed in the substrate by ion implantation, as the drain and the source of the PMOS transistor 24 respectively.

The input voltage Vin is coupled to the P+ doped region 204 of the PMOS transistor 24, and is also directly coupled to the N type well region 201. Because an ohmic contact is not provided at the location where the input voltage Vin is directly coupled to the N type region 201, a conduction barrier is higher there. This is equivalent to providing a Schottky diode connected in reverse series with a parasitic diode formed by the P+ type doped region 203 and the N type well region 201, such that current is blocked from flowing reversely back to the input voltage Vin from the output voltage Vo via the N type well region 201. Preferably, a P+ doped region 205 with a higher doping concentration can be further provided at a position near the Schottky diode in the N type well region 201 for better controlling a reverse leakage current of the Schottky diode.

As shown in FIG. 3, the circuit area occupied by the present invention is comparable to the circuit area of a single PMOS transistor 24 (plus the P+ doped region, which is very small), much smaller than the prior art. Since the unit area of the overall power switch device is reduced because the circuit area of the Schottky is saved, with the same total area of the power switch device, the PMOS transistor 24 in the present invention can employ a larger circuit area to further reduce the on-time resistance. More specifically, in comparison to prior art using the same total circuit area, the on-time resistance of the power switch device of the present invention is only approximately ¼ of the prior art, because the input-output path in the present invention does not include a Schottky diode, and the on-time resistance of the PMOS transistor 24 is only about half of the PMOS transistor in the prior art.

Figure 4:
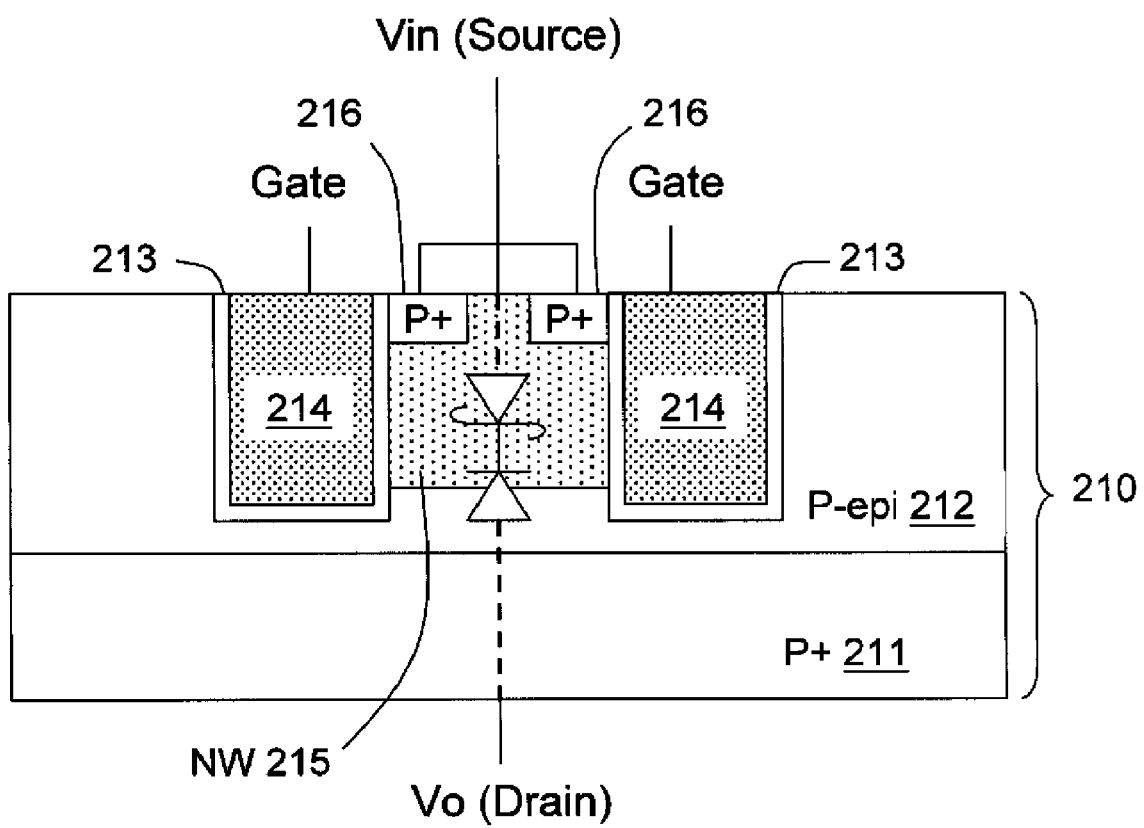
FIG. 4 illustrates another embodiment as to how the present invention may be embodied by a semiconductor structure.

FIG. 4 shows another embodiment of the present invention, wherein the PMOS transistor is a trench type transistor. As shown in the figure, two trenches are formed on a P type substrate 210; a gate oxide layer 213 is formed by thermal oxidation or by other methods; a conductor 214 (such as a doped silicon or other conductor) is filled in the trenches; thus, a gate of the trench type PMOS transistor is formed. In the substrate region between the two trenches, an N type doped well region 215 is formed by ion implantation (this step can be taken before of after the forming of the trenches), and a P+ heavily doped region 216 is formed on the surface of the N type well region 215; thus, a source of the trench type PMOS transistor is formed. The back side of the substrate is the drain of the trench transistor. In one embodiment, in order to provide a better ohmic contact for the drain, the P type substrate 210 preferably includes a P+ type body 211 with a higher doping concentration and a P type epitaxially grown region 212. Similarly to the previous embodiment, the input voltage Vin is coupled to the P+ type doped region 216 of the PMOS transistor 24, and is also directly coupled to the N type well region 215. Further, an ohmic contact is not provided at the location where the input voltage Vin is connected to the N type well region 215, such that a Schottky diode is formed there. In this embodiment, the P+ type doped region 216 acts as the source of the PMOS transistor 24 in one aspect, and also controls the reverse leakage current of the Schottky diode in another aspect.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. In view of the foregoing, the spirit of the present invention should cover all such and other modifications and variations, which should be interpreted to fall within the scope of the following claims and their equivalents.

What is claimed is:

1. An integrated device of a PMOS transistor and a Schottky diode, comprising:
   a PMOS transistor which includes a gate, a source, a drain and a channel region between the source and drain, wherein the source, drain and channel region are formed in a substrate, and a parasitic diode is formed between the drain and the channel region; and
   a Schottky diode formed in the substrate and connected in reverse series with the parasitic diode, the Schottky diode having one end connected with the parasitic diode and the other end connected with the source.

2. The integrated device of claim 1, wherein the Schottky diode includes a portion of a well region having the same conduction type as the channel region and not having an ohmic contact.

3. The integrated device of claim 1, wherein the Schottky diode further includes a doped region having a different conduction type from the channel region.

4. An integrated device of a PMOS transistor and a Schottky diode, comprising:
   a substrate;
   a conductive layer forming a gate of the PMOS transistor on the substrate;
   a first N-type well region, a portion of which forms a channel region of the PMOS transistor in the substrate;
   a first P-type doped region forming a drain of the PMOS transistor in the first well region, wherein a parasitic diode is formed between the drain and the well region;
   a second P-type doped region forming a source of the PMOS transistor in the first well region; and
   a Schottky diode formed by another portion of the first well region and connected in reverse series with the parasitic diode, said another portion of the first well region not having an N-type ohmic contact.

5. The integrated device of claim 4, wherein said another portion of the first region further includes a third P-type doped region.

6. An integrated device of a PMOS transistor and a Schottky diode, comprising:
   a P-type substrate forming a drain of the PMOS transistor;
   two conductors filled in the substrate to form a gate of the PMOS transistor;
   an N-type well region between the two conductors, the N-type well region having a portion which forms a channel region of the PMOS transistor, wherein a parasitic diode is formed between the drain and the channel region;
   a P-type doped region forming a source of the PMOS transistor above the N type well region; and
   a Schottky diode formed by another portion of the first well region and connected in reverse series with the parasitic diode, said another portion of the first well region not having an N-type ohmic contact.

7. The integrated device of claim 6, wherein at least two P-type doped regions are provided above the N type well region.

8. The integrated device of claim 6, wherein the substrate includes a body with a higher doping concentration and an epitaxially grown region with a lower doping concentration above the body.

* * * * *